United States Patent [19]
Mimotogi

[11] Patent Number: 5,906,903
[45] Date of Patent: May 25, 1999

[54] PROCESS TOLERANCE CALCULATING METHOD RELATING EXPOSURE AMOUNT AND FOCAL POINT POSITION TO ALLOWABLE DIMENSION VALUE

[75] Inventor: Shoji Mimotogi, Yokohama, Japan

[73] Assignee: Kabushiki Kaisha Toshiba, Kawasaki, Japan

[21] Appl. No.: 09/003,128

[22] Filed: Jan. 6, 1998

[30] Foreign Application Priority Data

Jan. 8, 1997 [JP] Japan ..................................... 9-001426

[51] Int. Cl.⁶ ..................................................... G03C 5/00
[52] U.S. Cl. ............................................................ 430/30
[58] Field of Search ............................................... 430/30

[56] References Cited

U.S. PATENT DOCUMENTS 5,756,242  5/1998  Koizumi et al. ......................... 430/30

FOREIGN PATENT DOCUMENTS 2-224319  9/1990  Japan .
6-216004  8/1994  Japan .

OTHER PUBLICATIONS

B.J. Lin, "Partially Coherent Imaging in Two Dimensions and the Theoretical Limits of Projection Printing in Microfabrication", IEEE Tran. Electron Devices, vol. ED–27, No. 5, pp. 931–938, 1980.

*Primary Examiner*—Christopher G. Young
*Attorney, Agent, or Firm*—Finnegan, Henderson, Farabow, Garrett & Dunner, L.L.P.

[57] ABSTRACT

A process tolerance calculating method which, in order to obtain a process tolerance in a process for forming a pattern on an object, to be processed, with the use of a projection light exposure apparatus, calculates a process tolerance for finding a relation of a light exposure amount and focal point position corresponding to a finished pattern of an allowable dimension value, comprising the steps of:

(1) measuring a variation in dimension of a to-be-formed pattern in terms of its length by varying a light exposure amount and focal point position by the projecting light exposure apparatus;

(2) finding a dependence of the measured pattern dimension upon the light exposure amount, at each varying focal position through a curve approximation;

(3) finding a dependence of the pattern dimension which is found through the curve approximation upon the focal point position at each varying light exposure amount;

(4) finding a light exposure amount corresponding to a finished pattern of an allowable dimension value, at each focal point position, from a result obtained at the step (3); and (5) finding a dependence of the light exposure amount upon the focal point position corresponding to the pattern of an allowable dimension value from a result obtained from the step (4).

7 Claims, 4 Drawing Sheets

PROCESS TOLERANCE CALCULATING METHOD RELATING EXPOSURE AMOUNT AND FOCAL POINT POSITION TO ALLOWABLE DIMENSION VALUE

BACKGROUND OF THE INVENTION

The present invention relates to the technique for finding a process tolerance in a semiconductor manufacturing process and to a method for calculating a process tolerance for finding a relation of a light exposure amount and focal point position corresponding to an allowable dimension value of a finished pattern formed from a resist pattern by lithography or from a pattern etched after a lithography.

Recently, attempts have been made to further extend a resolution limit to a finer dimension in the photolithography technique with the use of a new light exposure device technique, masking technique and resist technique. In order to quantity-produce an LSI with a pattern of a line width near such a finer-resolution limit, it is necessary to provide a process tolerance of over a given level.

Since, for example, the thickness of a resist film varies at a wafer surface area and in those coating devices, there occurs a variation in a proper amount of light with which a pattern is finished to a desired dimension. Further, there occurs a variation in focal point position resulting from the inaccuracy of the focal point positions the aberration of lenses, etc., in a light exposure device. And a variation in an amount of light exposure leads to an error in dimension of a finished resist pattern and a variation in the focal point position causes a variation in the shape of the finished resist pattern.

In the actual photolithography, a fluctuation in the amount of light exposure and in the focal point position exerts a greater influence over the finished dimension or configuration of the resin pattern. As the resolution becomes nearer to its limit, the process tolerance obtained is lowered and the resin pattern suffers a relative influence. In order to quantity-produce LSIs with a pattern of a line width near the resolution limit, it is necessary to provide a process tolerance of over a given value and hence to strictly find the process tolerance for evaluation.

By examining any adverse effects upon the dimension of the resist pattern caused by a variation in the amount of light exposure and focal point position it is possible to give judgment on whether or not LSIs can be quantity-produced with the light exposure method and resist process adopted. Further, it is also possible to determine the upper limit on the fluctuation in the amount of light exposure and focal point position.

In order to find the process tolerance on the variation in the focal point position and amount of light exposure, the dependence of the dimension (line width) of the resist pattern upon the focal point position and amount of light exposure is found. Based on this it is possible to find the range of the focal point position and amount of light exposure in terms of the dimension of the resist pattern, that is, the range in which semiconductor devices operate normally. This is called, here, a process tolerance allowing this dimensional range.

The process tolerance can be represented by two curves corresponding to the upper and lower limit line widths of an allowable range in terms of a desired pattern dimension in a graph with the defocusing plotted in a vertical direction and the amount of light exposure in a horizontal direction. Such a line diagram is referred to as an ED-tree.

A logical development of such a process tolerance is discussed in detail in a document (B. J. Lin, "Partially Coherent Imaging in Two Dimensions and Theoretical Limits of Projection Printing in Microfabrication", IEEE Tran. Electron Devices, vol. ED-27, pp.931 (1980)).

In order to accurately know the above-mentioned process tolerance, it is necessary to both include a range of a focal point position and that of an amount of light exposure capable of measuring a resist pattern's dimension and take a larger value than this range.

That is, if the resist pattern's line width corresponding to the measurable range of defocusing and amount of light exposure fails to reach the lower and upper limits of the allowable range, it is not possible to find corresponding values from the ED-tree. In other words, in the method for finding an ED-tree from a result of the dependence of the focal point position and of the amount of light exposure, it is not possible to obtain a right result in the case where a desired ED-tree falls outside the measured range of the focal point position or the amount of light exposure.

It may be considered that, for those outside the range, the procedure is taken whereby a result of measurement is predicted through the curve approximation. Even in this case, a right result has not been acquired in the case where there occurs a greater variation among results of measurement conducted.

In order to find the ED-tree for instance, measurement is made by varying the focal point position with an amount of light exposure given and, based on a measured resist pattern dimension, the dependence of the resist pattern dimension upon the focal point position is found from a regression analysis (curve approximation) in which case, if there is a greater variation among the results of measurement, it will be followed that an inaccurate approximation result is obtained at a greater defocusing area.

FIG. 6 shows the dependence of the resist's line width upon the defocusing in the case of using a positive type resist. Since the positive type resist is used, even if any resist's line width is taken at any defocusing area, the resist's line width should be made smaller when a greater amount of light exposure is involved than when a smaller amount of light exposure is involved, so that there sometimes occur crosses (points C in FIG. 6) though being dependent upon the results of measurement.

This is considered to be caused by errors of measurement at those areas where a greater defocusing occurs. If any curve approximation is done at those areas where greater errors of measurement occur, it follows that such errors are increased as greater ones.

BRIEF SUMMARY OF THE INVENTION

It is accordingly the object of the present invention to provide a process tolerance calculating method for accurately calculating a process tolerance on the basis of a measured pattern dimension.

A more detailed object of the present invention is to provide a process tolerance calculating method which, even if there occurs a greater measured error in a pattern dimension at a greater defocus area, can accurately find a relation of a light exposure amount and focal point position corresponding to a finished pattern of an allowable dimension value and can obtain a process tolerance as an output based thereon.

One aspect of the present invention is directed to a process tolerance calculating method which, in order to obtain a process tolerance in a process for forming a pattern on an object, to be processed, with the use of a projection light exposure apparatus, calculates a process tolerance for finding a relation of a light exposure amount and focal point position corresponding to a finished pattern of an allowable dimension value, comprising the steps of:

(1) measuring a variation in dimension of a to-be-formed pattern in terms of its length by varying a light exposure amount and focal point position by the projecting light exposure apparatus;

(2) finding a dependence of the measured pattern dimension upon the light exposure amount, at each varying focal point position, through a curve approximation;

(3) finding a dependence of the pattern dimension which is found through the curve approximation upon the focal point position at each varying light exposure amount;

(4) finding a light exposure amount corresponding to a finished pattern of an allowable dimension value, at each focal point position, from a result obtained at the step (3); and (5) finding a dependence of the light exposure amount upon the focal point position corresponding to the pattern of an allowable dimension value from a result obtained from the step (4).

If, regarding the measured pattern dimensions the focal point position dependence is first found through the curve approximation, since there occurs a greater error at a greater defocusing area in terms of its length, the error is enlarged through the curve approximations thus failing to obtain a proper result. The enlarging of such an error becomes more serious outside a range in which a focal point position is set.

The method of the present inventions on the other hand, finds, through a curve approximation, a dependence of a pattern dimension upon the light exposure amount as measured in terms of its length and finds a focal point position dependence on the basis of the result found. Since the light exposure amount is first found through the curve approximation, even if there occurs a greater error at a greater defocusing area on a pattern as measured in terms of its length, such an error is enlarged and it is not possible to obtain a proper result.

Another aspect of the present invention is directed to a computer program product which, in order to implement the process tolerance calculating method according to the first aspect of the present invention, includes instruction means for imparting necessary instructions.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

One embodiment of the present invention will be explained below with reference to the accompanying drawing.

Figure 1:
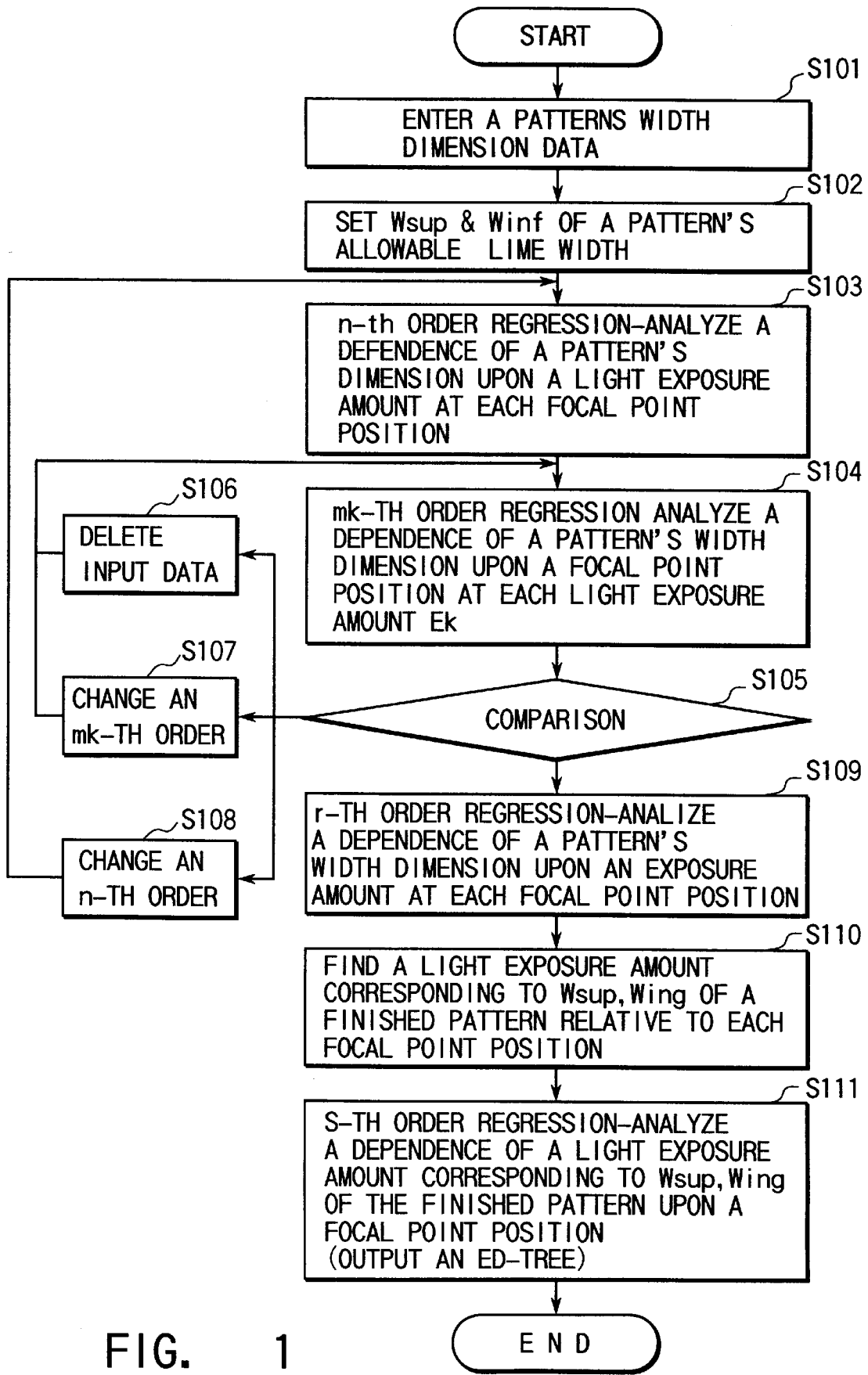
FIG. 1 is a flow chart showing a light exposure tolerance calculating method according to one aspect of the present invention.

FIG. 1 is a flow chart showing a process tolerance calculating method (S101 to S111) implemented by the running of a computer system.

Figure 2:
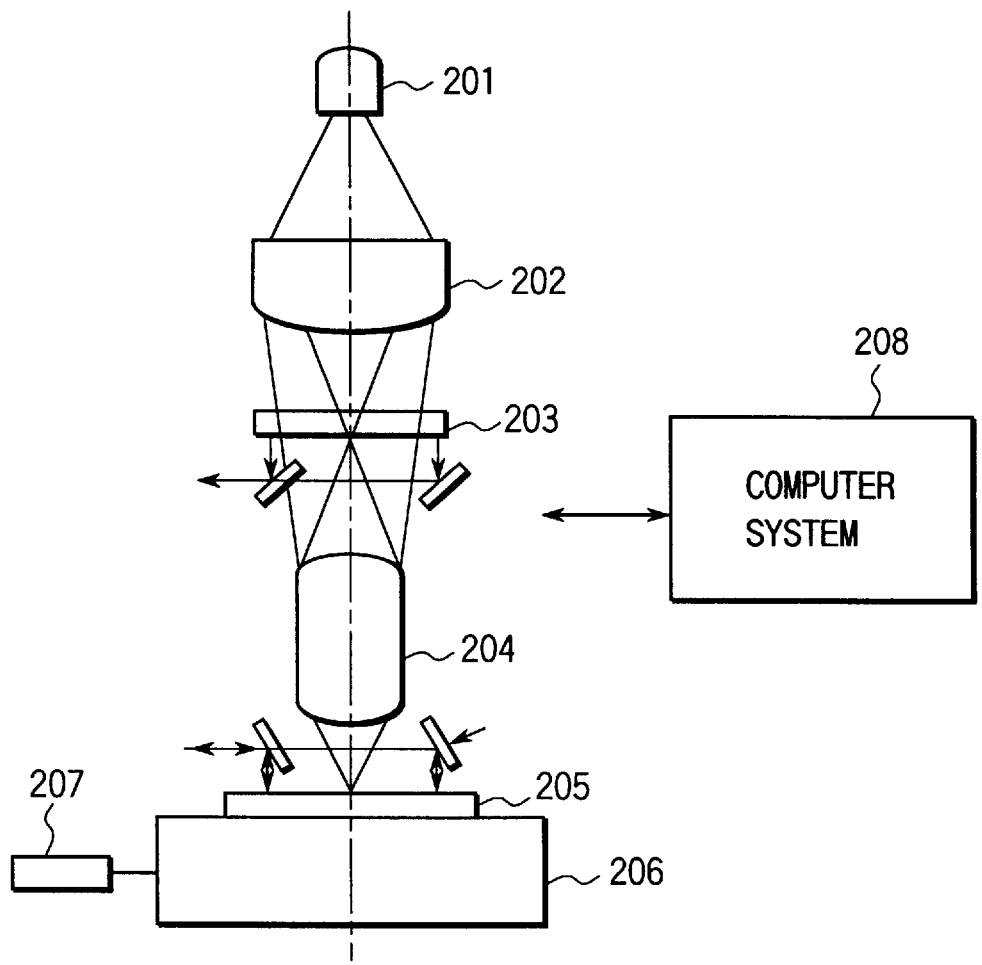
FIG. 2 is a view showing a basic arrangement of a projection light exposure apparatus to which the aspect of the present invention is applied.

Here, an apparatus according to an embodiment of the present invention shows an ordinary projection light exposure apparatus as shown in FIG. 2. In FIG. 2, reference numeral 201 denotes a light source; 202, a condensing lens; 203, a reticle with a mask pattern formed therein; 204, an object lens; 205, a wafer; 206, a stage; and 207, a laser interferometer. In order to make an amount of exposure light variable, it is only necessary to change the intensity of the light source 201 or an exposure time. Further, in order to make the focal position variable, it is only necessary to move the stage 206 in an up/down direction or the lens in an up/down direction.

In FIG. 2, reference numeral 208 shows a computer system for performing a process tolerance calculating method on the present embodiment. The computer system included storage media (not shown), such as a RAM and hard disk, for storing a computer program for implementing the steps as shown in FIG. 1.

Figure 3:
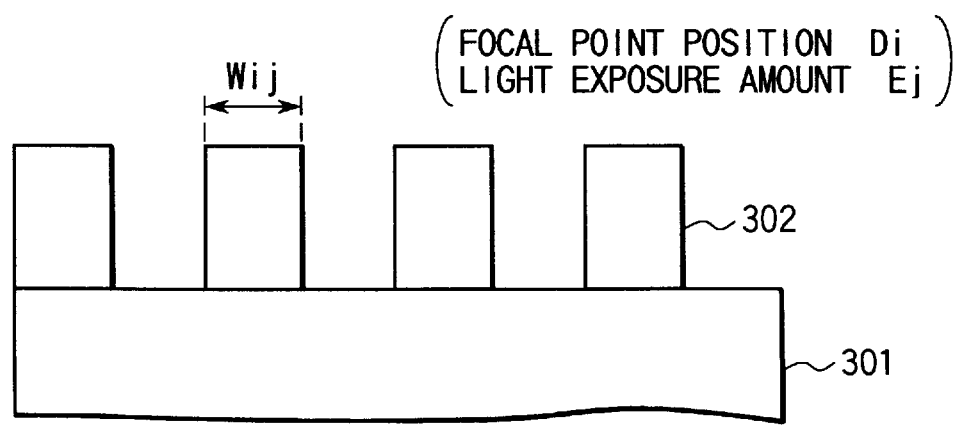
FIG. 3 is a view showing one form of a resist pattern formed in accordance with the aspect of the present invention.
Figures 4, 5:
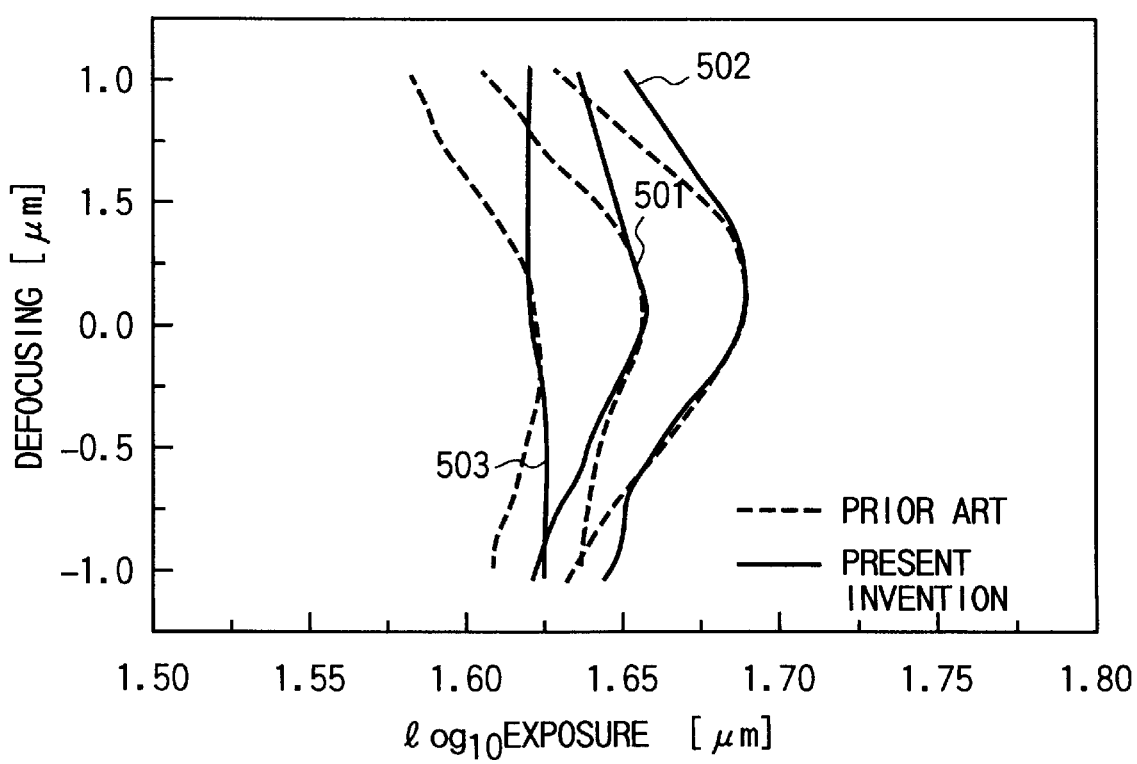
FIG. 4 shows a matrix of pattern dimension width data prepared in accordance with the aspect of the present invention.
FIG. 5 is a graph showing a result of calculation on a process tolerance obtained in accordance with the aspect of the present invention.
Figure 6:
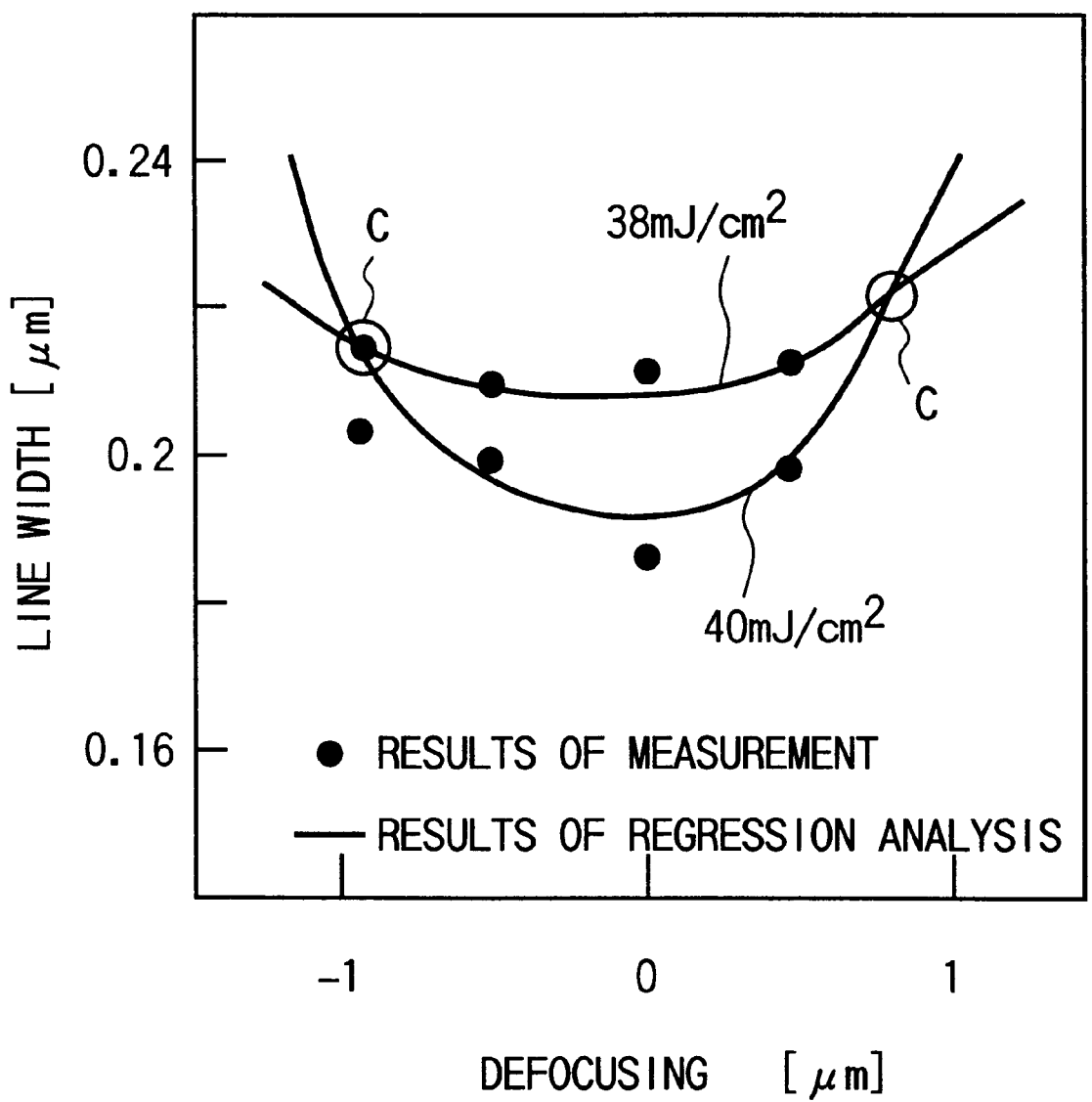
FIG. 6 is a graph showing a result of regression analysis made in a defocusing direction in accordance with a conventional method.

A positive type resist 302 on a wafer was irradiated, by the projection light exposure apparatus, with light, that is, irradiated at a light amount level Ej (j=1, 2, . . . q) and focal point position Di (i=1, 2, . . . , p) in a line-and-space pattern as shown in FIG. 3 and the pattern was developed with a desired developing solution and measured in terms of the pattern's width Wij. And various measurements were similarly conducted by sequentially varying the focal position Di and light exposure amount level Ej and corresponding matrix data was obtained as shown in FIG. 4.

In the S101 in FIG. 1, the pattern dimension data Wij is input to the computer system 208. Then the upper limit Wsup and lower limit Winf of an allowable line width are set at step S102.

At step S103, the dependency of the pattern width Wkj (j=1, 2, . . . , q) per focal point position Dk (1, 2, . . . , p) upon the amount of light exposure is found through an n-order regression analysis. That is, with the focal point position fixed, the pattern width (width data) Wkj relative to a variation in the amount of exposure light is curve-approximated with an approximation function comprised of a corresponding n-order polynomial (n $\geq$ 1). Through the regression analysis it is possible to smooth a variation in measured data Wkj and also to predict data outside a range in which the amount of exposure light can be set.

At step S104, the dependence of the pattern width Wkj per light exposure amount Ek (k=1, 2, . . . , q) upon the focal point position is found, through an mk-th regression analysis, with the use of results found at step S103. That is, with the light exposure amount fixed, the pattern's width data (data properly corrected at step S103) relative to the variation of the focal position is regression-analyzed (curve-approximated) with the use of an approximation function comprised of an mk-order polynomial (mk≧1).

Then, at step S105, comparison is made between a result obtained at step S104 and the data input at the data input step S101. Step S106 deletes those data points deviated in an extreme way. Or steps S108 and S107 change the regression orders n, mk, etc., at steps S103, S104. And steps from S103 to S108 are repeated until the best approximation is obtained. In this connection it is to be noted that better approximations are obtained normally for n=1, mk=2 or n=1, mk=4.

Then steps S109 and S110 find corresponding first exposure amounts with which the upper and lower limits of the pattern's width are obtained. That is, first, step S109 receives data properly corrected by step S105 and the dependence of the pattern's width per focal position Dk (k=1, 2, . . . , p) upon the light exposure amount is found with the use of as r-th order regression analysis. That is, with the focal position fixed, pattern's width data relative to a variation in light exposure amount is curve-approximated with the use of an approximation function comprised of an r-th order polynomial (r≧1).

Through the utilization of the result obtained at step S109, it is possible to find light exposure amounts, at each focal distance, with which the upper limit Wsup and lower limit Winf of an allowable line width are defined.

Finally, step S111 finds an ED-tree representing the tolerance of the light exposure amount. That is, step S111 finds the dependence of the respective light exposure amount upon the focal position, through the curve approximation by an approximation function (an S-th polynomial), with the use of the light exposure amounts with which the upper limit Wsup and lower limit Winf are defined. It is, therefore, possible to obtain an ED-tree comprised of smoother curves 502 (upper limit Wsup) and 503 (lower limit Winf). In this connection it is to be noted that a curve indicated by 501 in FIG. 5 corresponds to a line width as designed. In this embodiment, the following conditions were used for light exposure:

$\lambda$=248 nm, NA=0.6, and a resist=a chemically amplified positive type resist. Further, a mask constitutes a line-and-space pattern with a pitch of 1.6 $\mu$m. And the measuring range of the focal position is −0.6 $\mu$m to 0.6 $\mu$m and the measuring range of the light exposure amount is 40 mJ/cm$^2$ to 52 mJ/cm$^2$. The upper limit of the allowable dimension of the line width on the wafer was 0.22 $\mu$m (+10%) and the lower limit was 0.18 $\mu$m (−10%).

As a result, it was possible to obtain a result of calculation true to an actual process tolerance.

For comparison, regression analysis was made first on the dependence of the focal point and then on the dependence of the light exposure amount and a result of calculation relating to the process tolerance is superimposed as indicated by the dotted lines in FIG. 5. From FIG. 5 it is found that greater errors emerge at greater defocus areas.

The present invention is not restricted to the above-mentioned embodiment. Although, in the present embodiment, explanation is given about the method for calculating the process tolerance on the lithographic process relating to the dimension of a finished resist, the present invention can be similarly be applied also to the calculation of the process tolerance in the etching process. In this case, it is only necessary to, in place of measuring the dimension of the resist pattern, measure the dimension of the pattern formed by the etching made after the lithographic process.

Although, in the present embodiment, the process tolerance is calculated with the use of a result of measurement actually obtained by the projection light exposure apparatus, the present invention is not restricted thereto It may be possible to make calculation on the process tolerance with the use of the pattern width obtained by simulation The procedure set out in the above-mentioned embodiment can be written as a computer program, that is, a program for performing calculation on the process tolerance by a computer system, in a recording medium, such as a magnetic disk (a floppy disk, hard disk, etch), optical disk (CD-ROM, DVD, etc.), semiconductor memory, and so on and can be applied as such to various kinds of apparatuses and as a transmission communications medium to various kinds of apparatuses.

Needless to say, various changes or modifications of the present invention can be made without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

I claim:

1. A process tolerance calculating method which, in order to obtain a process tolerance in a process for forming a pattern on an object, to be processed, with the use of a projection light exposure apparatus, calculates a process tolerance for finding a relation of a light exposure amount and focal point position corresponding to a finished pattern of an allowable dimension value, comprising the steps of:

(1) measuring a variation in dimension of a to-be-formed pattern in terms of its length by varying a light exposure amount and focal point position by the projecting light exposure apparatus;

(2) finding a dependence of the measured pattern dimension upon the light exposure amount, at each varying focal position through a curve approximation;

(3) finding a dependence of the pattern dimension which is found through the curve approximation upon the focal point position at each varying light exposure amount;

(4) finding a light exposure amount corresponding to a finished pattern of an allowable dimension value, at each focal point position, from a result obtained at the step (3); and (5) finding a dependence of the light exposure amount upon the focal point position corresponding to the pattern of an allowable dimension value from a result obtained from the step (4).

2. The method according to claim 1, wherein the object to be processed is comprised of a resist formed on a substrate and the process tolerance calculating method finds a relation of the light exposure amount and focal point position corresponding to a finished pattern of an allowable dimension value which is transferred to the resist.

3. The method according to claim 1, wherein the object to be processed is comprised of a substrate to be subjected to light exposure/development and etching, and the process tolerance calculating method finds a relation of the light exposure amount and focal point position corresponding to a finished circuit pattern of an allowable dimension value which is formed on the substrate by a light exposing/ developing and etching steps.

4. The method according to claim 1, wherein the step (4) comprises finding a dependence, upon the light exposure amount, of the pattern dimension found from the step (3) through a curve approximation and finding a light exposure amount corresponding to a finished pattern of an allowable dimension value from this curve at each focal point position.

5. The method according to claim 1, wherein the fifth step includes a step of finding a dependence of the light exposure amount corresponding to the finished pattern of an allowable dimension value through a curve approximation.

6. The method according to claim 1, further comprising a step of comparing a result obtained from the step (3) with a result of measurement by the step (1) and optimizing an output result of the step (3) on the basis of the step (3).

7. The method according to claim 6, wherein the step of optimizing an output result of the step (3) comprises changing an order of the approximation function, re-running the steps (2) and (3), and optimizing an output result of the step (3).

\* \* \* \* \*